US012621929B2

(12) United States Patent
Lou et al.

(10) Patent No.: US 12,621,929 B2
(45) Date of Patent: May 5, 2026

(54) ELASTIC INTERPOSER AND CONDUCTIVE DEVICE THEREOF

(71) Applicant: XINGR TECHNOLOGIES (ZHEJIANG) LIMITED, Yiwu City (CN)

(72) Inventors: Choon Leong Lou, Singapore (SG); Ho-Yeh Chen, Zhubei City (TW)

(73) Assignee: XINGR TECHNOLOGIES (ZHEJIANG) LIMITED, Yiwu City (CN)

( * ) Notice: Subject to any disclaimer, the term of this patent is extended or adjusted under 35 U.S.C. 154(b) by 237 days.

(21) Appl. No.: 18/399,317

(22) Filed: Dec. 28, 2023

(65) Prior Publication Data

US 2025/0113435 A1     Apr. 3, 2025

(30) Foreign Application Priority Data

Sep. 28, 2023    (CN) .......................... 202311285157.9

(51) Int. Cl.
   H05K 1/02       (2006.01)
   H05K 1/189     (2026.01)

(52) U.S. Cl.
   CPC ............. *H05K 1/028* (2013.01); *H05K 1/189* (2013.01); *H05K 2201/0302* (2013.01);
           (Continued)

(58) Field of Classification Search
   None
   See application file for complete search history.

(56) References Cited

U.S. PATENT DOCUMENTS

2006/0170112 A1* 8/2006 Tanaka ................... H01L 24/05
                                   257/777
2011/0024167 A1* 2/2011 Hashimoto .......... H05K 3/4688
                                   29/846

(Continued)

FOREIGN PATENT DOCUMENTS

CN      109782030 A    5/2019
CN      112930574 A    6/2021

(Continued)

OTHER PUBLICATIONS

KR 20220007410 A (Translation) (Year: 2025).*

(Continued)

*Primary Examiner* — Timothy J Thompson
*Assistant Examiner* — John B Freal
(74) *Attorney, Agent, or Firm* — MUNCY, GEISSLER, OLDS & LOWE, P.C.

(57) ABSTRACT

The present disclosure provides an elastic interposer including a flexible substrate and a conductive device. The flexible substrate includes multiple circuits, of which first terminals are exposed on a first surface of the flexible substrate and show a first pattern, and of which second terminals are exposed on a second surface of the flexible substrate and show a second pattern different from the first pattern. The conductive device includes a first flexible conductive element and a second flexible conductive element. The first flexible conductive element is disposed on the first surface of the flexible substrate, and includes multiple first elastic conductive portions electrically connected to the first terminals of the circuits. The second flexible conductive element is disposed on the second surface of the flexible substrate, and includes multiple second elastic conductive portions electrically connected to the second terminals of the circuits.

16 Claims, 11 Drawing Sheets

(52) U.S. Cl.
      CPC ................ *H05K 2201/0364* (2013.01); *H05K 2201/10378* (2013.01); *H05K 2201/10886* (2013.01)

(56) References Cited

U.S. PATENT DOCUMENTS

| | | | |
|---|---|---|---|
| 2012/0015532 A1* | 1/2012 | Markovich | H05K 3/3436 |
| | | | 439/78 |
| 2012/0112779 A1 | 5/2012 | Smith et al. | |
| 2017/0330767 A1* | 11/2017 | Kang | C23C 14/024 |
| 2020/0253037 A1 | 8/2020 | Marin et al. | |
| 2020/0258828 A1 | 8/2020 | Iida et al. | |
| 2022/0005626 A1 | 1/2022 | Oh et al. | |
| 2023/0038892 A1 | 2/2023 | Chen et al. | |

FOREIGN PATENT DOCUMENTS

| | | | | |
|---|---|---|---|---|
| JP | 2008059895 A | 3/2008 | | |
| KR | 20220007410 A | * | 1/2022 | H01L 25/0657 |
| TW | I431282 B | 3/2014 | | |
| TW | 201539596 A | 10/2015 | | |
| TW | I645195 B | 12/2018 | | |
| TW | I666454 B | 7/2019 | | |
| TW | I716255 B | 1/2021 | | |
| TW | 202203338 A | 1/2022 | | |
| WO | WO-2009075220 A1 | 6/2009 | | |

OTHER PUBLICATIONS

Office Action dated Apr. 22, 2024 from the ROC counterpart application, the search report attached to the Office Action, the summary translation of the Office Action.
Notice of Allowance of correponding CN Application No. 202311285157.9 and English translation, dated Oct. 17, 2025, 6 pages.

* cited by examiner

231

2311

231C

233

2331

233C

ELASTIC INTERPOSER AND CONDUCTIVE DEVICE THEREOF

CROSS REFERENCE TO RELATED APPLICATION

This application claims priority of China patent application No. CN202311285157.9 filed on Sep. 28, 2023, which is incorporated by reference in its entirety.

TECHNICAL FIELD

The present disclosure relates to an elastic interposer and, more particularly, to a flexible elastic interposer and a conductive device thereof.

DISCUSSION OF THE BACKGROUND

Various integrated circuit chips need to undergo electrical testing during the process of manufacturing. When an object under test needs to undergo high-frequency signal testing, a test result is considered more reliable when an electrical path for signal transmission is shorter. In the prior art, space transformation substrates or pogo pins are frequently used for transmission of high-frequency test signals between the object under test and a circuit board.

However, regarding the use of pogo pins, due to inherent mechanism properties of pogo pins, it is difficult to further reduce sizes such that a shorter signal transmission path can hardly be achieved. Moreover, for the use of space transformation substrates, due to manufacturing complications and cost considerations, it is similarly difficult to provide a shorter signal transmission path. In addition, since current space transformation substrates are mostly made of hard materials that provide limited resilience and flexibility, an object under test can be easily damaged when the space transformation substrates come into contact with the object under test. Accordingly, there is a need for a solution for a structure that provides a shorter signal transmission path and has high flexibility, so as to stably transmit high-frequency test signals between the object under test and a circuit board.

The details of the "prior art" above describe merely background techniques, and are not to be construed as description for the subject matter of the present disclosure or the prior art of the present disclosure. In addition, the details of the "prior art" above are not to be considered as any part of the present application.

SUMMARY

In view of the above, it is an objective of the present disclosure to provide an elastic interposer with a shorter conductive path as well as high resilience and high flexibility.

An embodiment of the disclosure provides an elastic interposer. The elastic interposer includes a flexible substrate and a conductive device. The flexible substrate includes a plurality of circuits. First terminals of the circuits are exposed on a first surface of the flexible substrate and second terminals of the circuits are exposed on a second surface of the flexible substrate. The first terminals of the circuits show a first pattern on the first surface, the second terminals of the circuits show a second pattern on the second surface, and the first pattern is different from the second pattern. The conductive device includes a first flexible conductive element and a second flexible conductive element. The first flexible conductive element is disposed on the first surface of the flexible substrate, and includes a plurality of first elastic conductive portions. First terminals of the first elastic conductive portions are exposed on a third surface of the first flexible conductive element, and second terminals of the first elastic conductive portions are exposed on a fourth surface of the first flexible conductive element and are electrically connected to the first terminals of the circuits. The second flexible conductive element is disposed on the second surface of the flexible substrate, and includes a plurality of second elastic conductive portions. First terminals of the second elastic conductive portions are exposed on a fifth surface of the second flexible conductive element and are electrically connected to the second terminals of the circuits, and second terminals of the second elastic conductive portions are exposed on a sixth surface of the second flexible conductive element.

An embodiment of the disclosure provides a conductive device. The conductive device includes a first flexible conductive element and a second flexible conductive element. The first flexible conductive element is disposed on a first surface of a flexible substrate, and includes a first flexible body and a plurality of first elastic conductive portions. The first elastic conductive portions are disposed in the first flexible body, and are configured to be electrically connected to first terminals of a plurality of circuits of the flexible substrate. The second flexible conductive element is disposed on a second surface of the flexible substrate, and includes a second flexible body and a plurality of second elastic conductive portions. The second elastic conductive portions are disposed in the second flexible body, and are configured to be electrically connected to second terminals of a plurality of the circuits of the flexible substrate. The first terminals of the circuits are exposed on the first surface and show a first pattern, the second terminals of the circuits are exposed on the second surface and show a second pattern, and the first pattern is different from the second pattern.

Accordingly, since the elements of the elastic interposer of the present disclosures are all flexible, the overall resilience and flexibility can be significantly enhanced. Moreover, the two flexible conductive elements of the conductive device of the present disclosure are made by means of filling metal conductive portions (for example, conductive paste) into a sheet-like flexible insulation material, so that a shorter conductive path between an object under test and a circuit board can be provided.

The technical features and advantages of the present disclosure are in general comprehensively provided in the description above, so as to enable better understanding of the present disclosure as details provided in the description below. The other technical features and advantages forming the subject matter of the claims of present disclosure are provided in the description below. A person skilled in the art of the present disclosure should understand that, it would be easy to implement objects same as those of present disclosure by modifications or designs of other structures or processes on the basis of the concept and specific embodiments disclosed in the description below. Moreover, a person skilled in the art should understand that such equivalent arrangements are encompassed within the spirit and scope of the present disclosure as defined by the appended claims.

BRIEF DESCRIPTION OF THE DRA WINGS

Persons skilled in the art can gain insight into the disclosure by referring to the embodiments, claims and drawings of the disclosure. In the drawings, like components are denoted by like reference numerals.

DETAILED DESCRIPTION

Figure 1A:
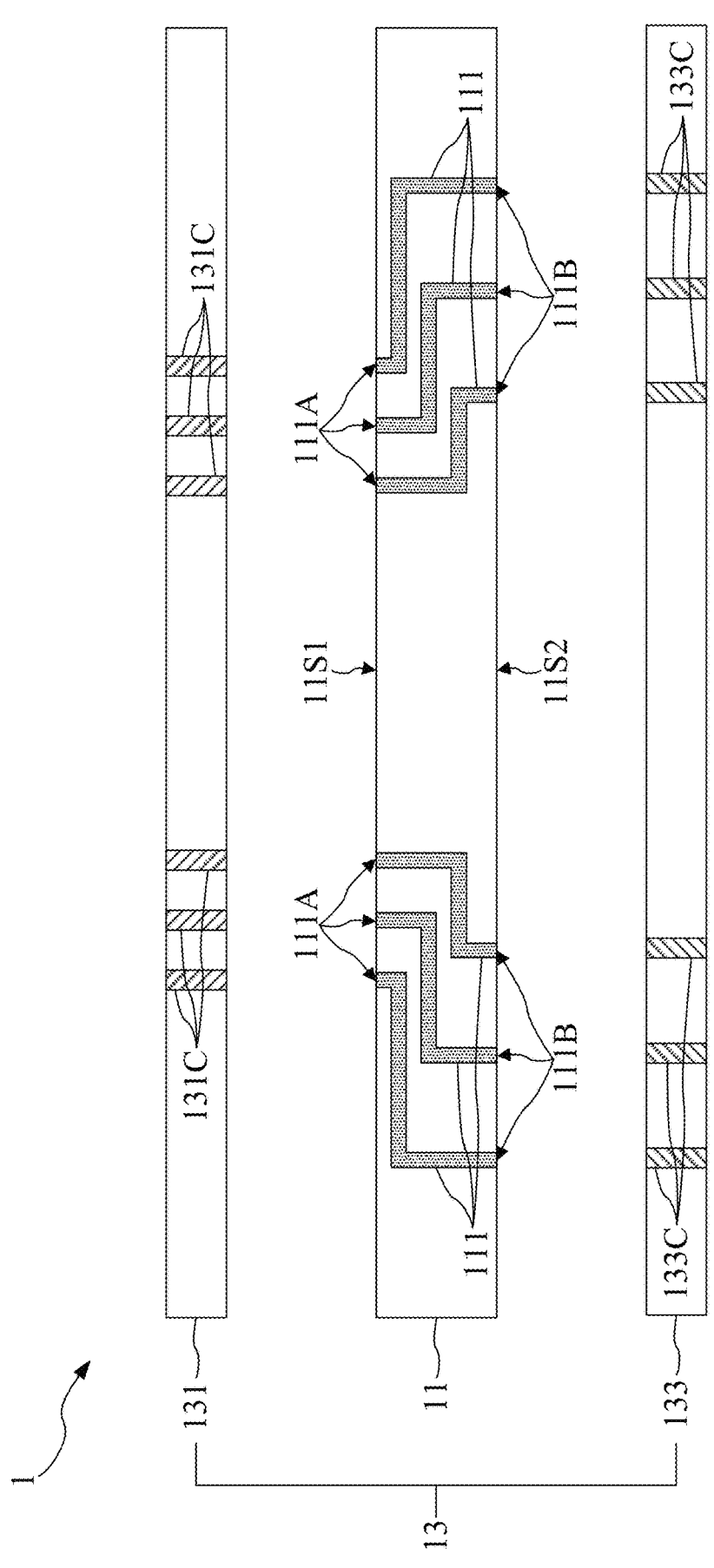
FIG. 1A is a schematic diagram of an elastic interposer according to some embodiments of the present disclosure.

The description of the present disclosure below is accompanied by drawings forming a part of the description to illustrate embodiments of the present disclosure. However, it should be noted that the present disclosure is not limited to these embodiments. Moreover, the embodiments below can be appropriately integrated into another embodiment.

The terms "embodiment," "an embodiment," "exemplary embodiment," "other embodiment" and "another embodiment" mean that the embodiments described in the present disclosure can include specific features, structures or characteristics; however, it should be noted that not every embodiment needs to include such specific features, structures or characteristics. In addition, repeated use of the expression "in the embodiment" or "of the embodiment" does not necessarily refer to the same embodiment, but may refer to the same embodiment.

To fully understand the present disclosure, steps and structures are described in detail below. It should be obvious that implementation of the present disclosure does not limit specific details generally known to persons skilled in the art. Further, generally known structures and steps are not described in detail, so as to prevent unnecessary limitation to the present disclosure. Preferred embodiments of the present disclosure are described in detail below. However, apart from the detailed description, the present disclosure can also be extensively applied in other embodiments. The scope of the present disclosure is not limited to the contents given in the detailed description, but is to be defined in accordance with the appended claims.

It should be understood that the disclosure below provides various different embodiments or implementation examples for implementing different features of the present disclosure. Specific embodiments or implementation examples of components and arrangements are set forth below to simplify the present disclosure. It should be noted that such details are exemplary and are not to be intended to be restrictive. For example, a size of an element is not limited to a disclosed range or value, but can depend on an expected property of a manufacturing condition and/or device. Moreover, in the description below, a first feature described as formed "on" or "above" a second feature may include embodiments in which the first feature and the second feature are formed in a direct contact manner, and may also include embodiments in which an additional feature is formed between the first feature and the second feature in a way that the first feature and the second feature may not be in direct contact. For simplicity and clarity, various features may be depicted according to different scales. In the accompanying drawings, some layers/features are omitted for the sake of simplicity.

Moreover, for better illustration, terms of relative spatial relations such as "beneath," "below," "lower," "above" and "upper" may be used to describe a relation of one element or feature relative to another element or feature. Such terms of relative spatial relations are intended to cover different orientations of the element during use or operation in addition to the orientation depicted in the drawings. An apparatus may be orientated otherwise (rotated 90 degrees or having another orientation) and the descriptive terms of the relative spatial relations used in the literature may also be similarly and correspondingly interpreted.

An elastic interposer provided according to an embodiment of the present disclosure includes a flexible substrate and a conductive device. The conductive device includes two flexible conductive elements. One of the two flexible conductive elements is disposed on one surface of the flexible substrate and is configured to be connected to a circuit contact of the flexible substrate and a circuit contact of an object under test; the other of the two flexible conductive elements is disposed on the other surface of the flexible substrate, and is configured to be connected to a circuit contact of the flexible substrate and a circuit contact of a circuit board. Accordingly, since both the flexible substrate and the flexible conductive elements of the elastic interposer are flexible, the overall resilience and flexibility can be significantly enhanced, thereby providing the ability for absorbing and buffering forces of impact brought by various physical contact and hence reducing damage of the object under test. Moreover, the flexible conductive elements are made by means of filling metal conductive portions (for example, conductive paste) into a sheet-like flexible insulation material. Thus, the overall thickness of the elastic interposer is effectively reduced, and a shorter conductive path between the object under test and a circuit board is provided. Details of the structures above are described in the embodiments below.

Figure 1B:
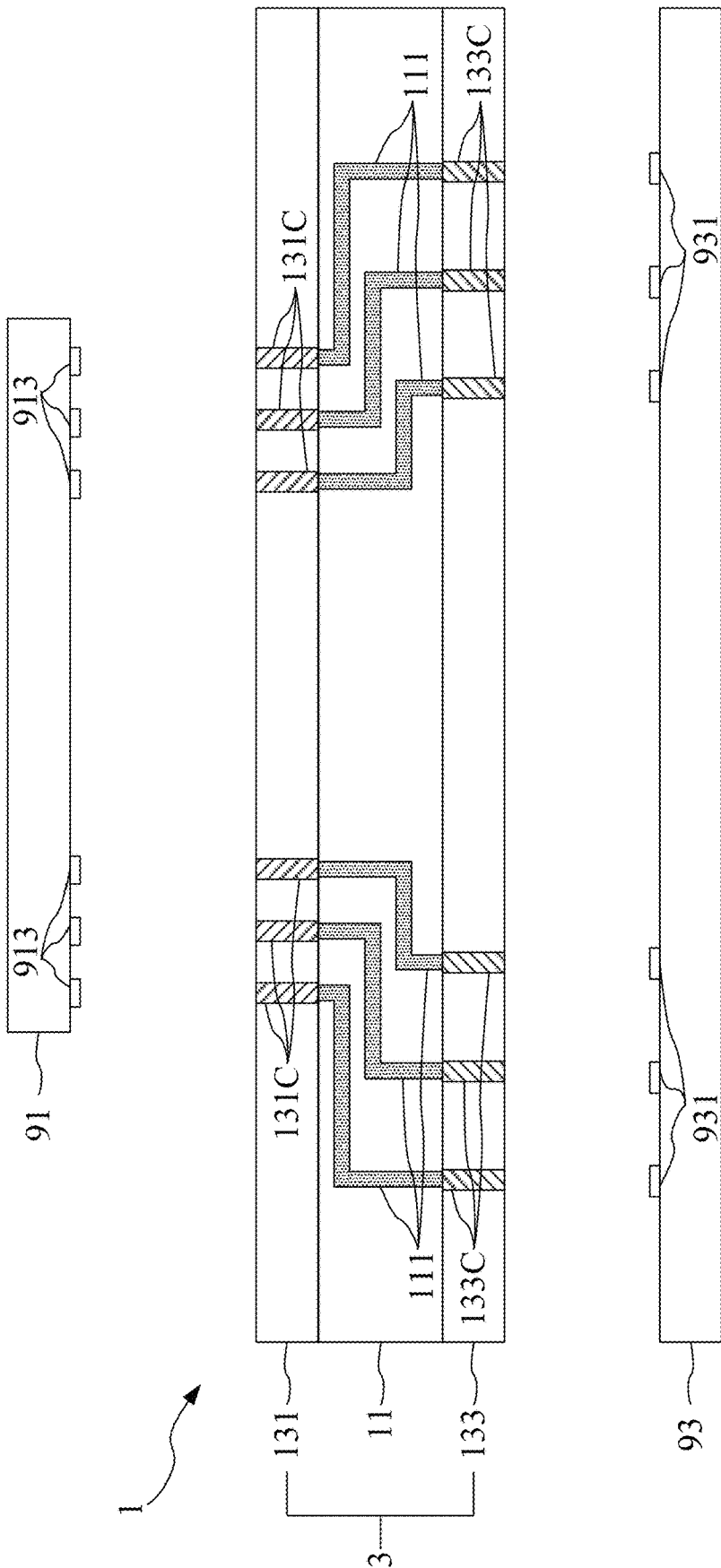
FIG. 1B is a schematic diagram of an elastic interposer according to some embodiments of the present disclosure.

Refer to FIG. 1A and FIG. 1B. FIG. 1A shows a schematic diagram of an elastic interposer 1 according to some embodiments of the present disclosure. FIG. 1B shows another schematic diagram of the elastic interposer 1 according to some embodiments of the present disclosure. More specifically, the elastic interposer 1 includes a flexible substrate 11 and a conductive device 13. The flexible substrate 11 includes a plurality of circuits 111, and has a first surface 11S1 and a second surface 11S2. The conductive device 13 includes a first flexible conductive element 131 and a second flexible conductive element 133. The first flexible conductive element 131 is disposed on the first surface 11S1 of the flexible substrate 11, and includes a plurality of first elastic conductive portions 131C. The second flexible conductive element 133 is disposed on the second surface 11S2 of the flexible substrate 11, and includes a plurality of second elastic conductive portions 133C. In some embodiments, the first elastic conductive portions 131C can be flexible, and the second elastic conductive portions 133C can also be flexible.

In some embodiments, each of the circuits 111 of the flexible substrate 11 has a first terminal 111A and a second terminal 111B. The first terminals 111A of the circuits 111 are exposed on the first surface 11S1 of the flexible substrate 11, and are electrically connected to the first elastic conductive portions 131C of the first flexible conductive element 131. The second terminals 111B of the circuits 111 are exposed on the second surface 11S2 of the flexible substrate 11, and are electrically connected to the second elastic conductive portions 133C of the second flexible conductive element 133.

Figure 1C:
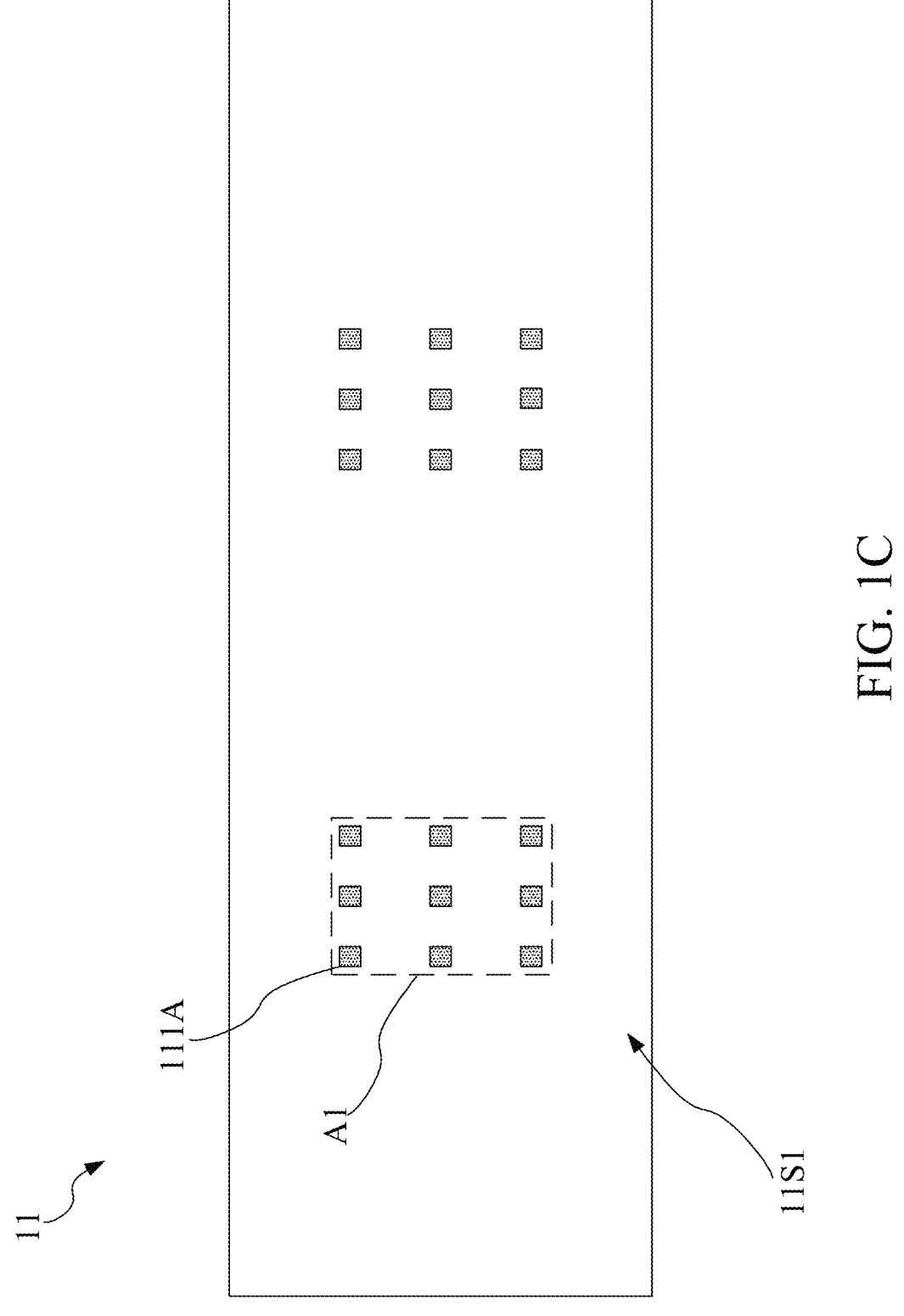
FIG. 1C is a top view of a flexible substrate according to some embodiments of the present disclosure.
Figure 1D:
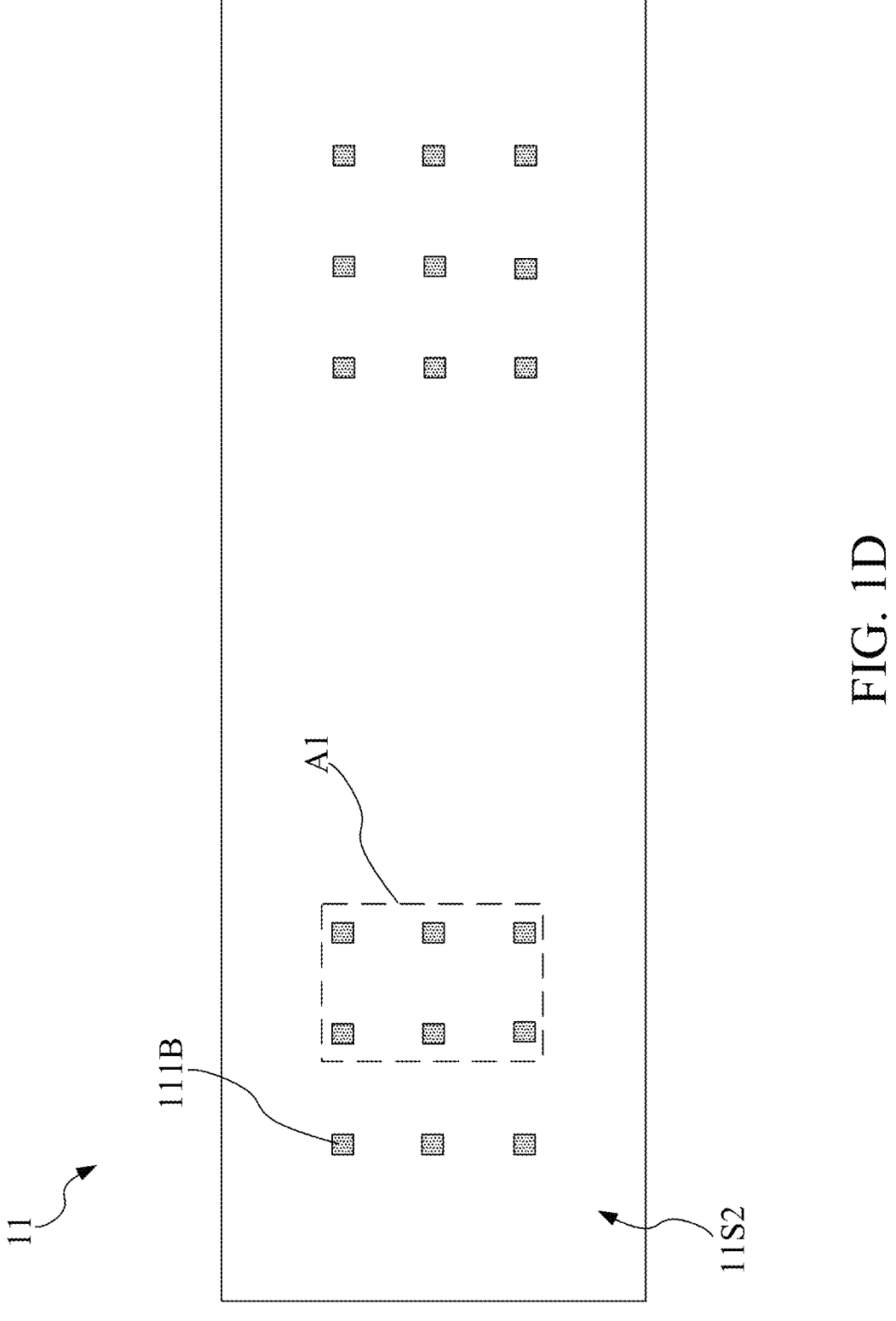
FIG. 1D is a bottom view of a flexible substrate according to some embodiments of the present disclosure.

Refer to FIG. 1C and FIG. 1D. FIG. 1C shows a top view of the flexible substrate 11 according to some embodiments of the present disclosure. FIG. 1D shows a bottom view of the flexible substrate 11 according to some embodiments of the present disclosure. In some embodiments, the first terminals 111A of the circuits 111 show a first pattern on the first surface 11S1 of the flexible substrate 11, and the second terminals 111B of the circuits 111 show a second pattern on the second surface 11S2 of the flexible substrate 11, wherein the first pattern is different from the second pattern. In other words, there is a change in a layout and traces of the circuits 111 from the first terminals 111A through the flexible substrate 11 to the second terminals 111B, and so the first pattern shown by the first terminals 111A on the first surface 11S1 is different from the second pattern shown by the second terminals 111B on the second surface 11S2.

In some embodiments, a density of the first terminals 111A of the circuits 111 within a unit area A1 is greater than a density of the second terminals 111B of the circuits 111 within the same unit area A1. In other words, within the unit area A1 of the same area range, the density of the first terminals 111A of the circuits 111 is denser while the density of the second terminals 111B of the circuits 111 is sparser.

In some embodiments, a minimum gap between any two of the first terminals 111A in the first pattern is less than a minimum gap between any two of the second terminals 111B in the second pattern. In some embodiments, by ruling out the first terminal 111A at an extremum (farther away from a center or closer to an edge) in the first pattern and ruling out the second terminal 111B at an extremum (farther away from a center or closer to an edge) in the second pattern, the minimum gap between any two of the first terminals 111A in the first pattern is less than the minimum gap between any two of the second terminals 111B in the second pattern. In some embodiments, by ruling out a dummy contact in the first pattern and a dummy contact in the second pattern, the minimum gap between any two of the first terminals 111A in the first pattern is less than the minimum gap between any two of the second terminals 111B in the second pattern.

In some embodiments, the first elastic conductive portions 131C of the first flexible conductive element 131 are further configured to come into electrical contact with a plurality of contacts 913 of an object 91 under test, and the second elastic conductive portions 133C of the second flexible conductive element 133 are further configured to come into electrical contact with a plurality of contacts 931 of a hard substrate 93. As such, an electrical path produced by the circuits 111, the first elastic conductive portions 131C and the second elastic conductive portions 133C of the elastic interposer 1 can be used to transmit test signals (for example, high-frequency test signals) between the object 91 under test and the hard substrate 93.

Figure 2A:
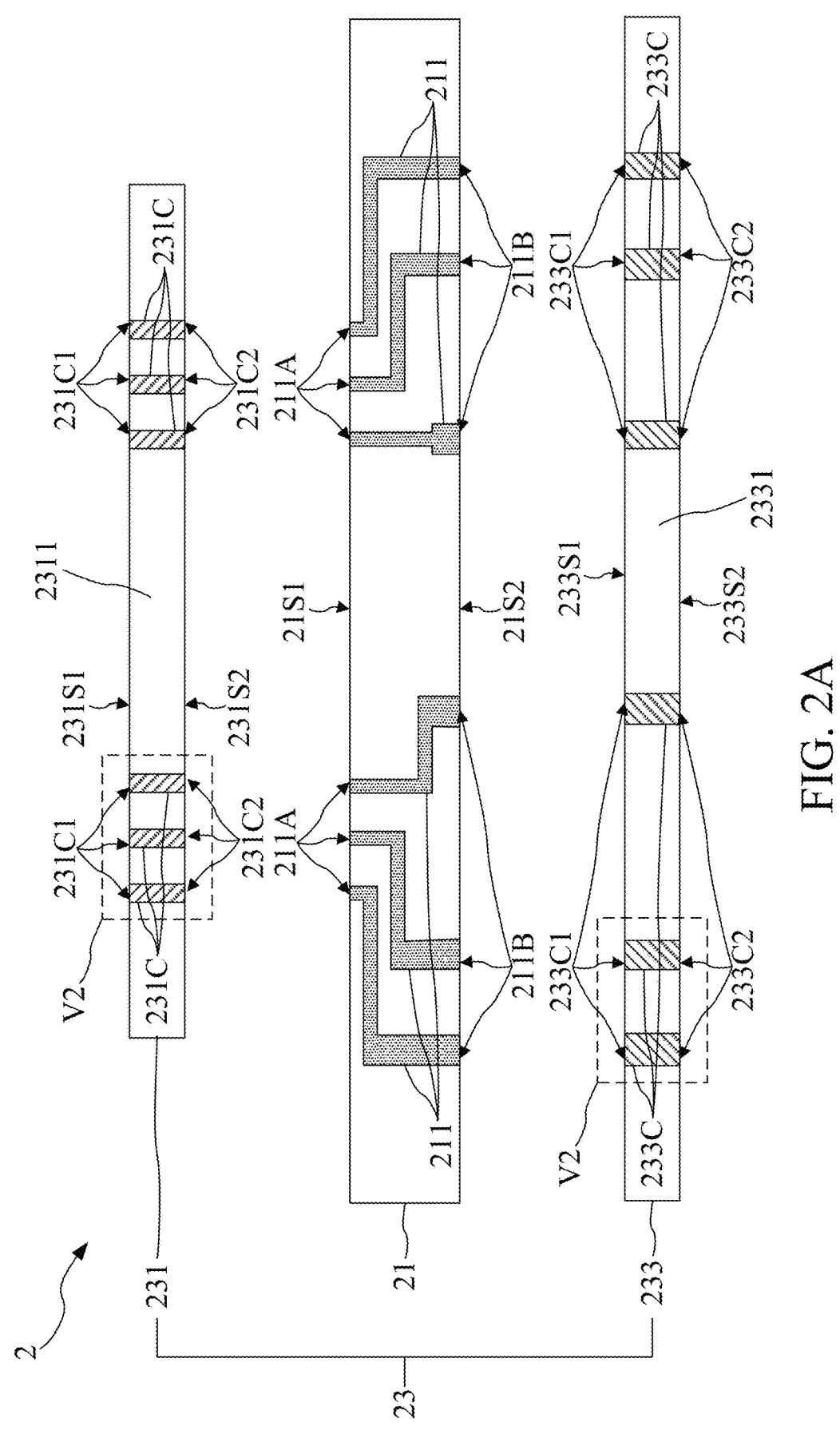
FIG. 2A is a schematic diagram of an elastic interposer according to some embodiments of the present disclosure.
Figure 2B:
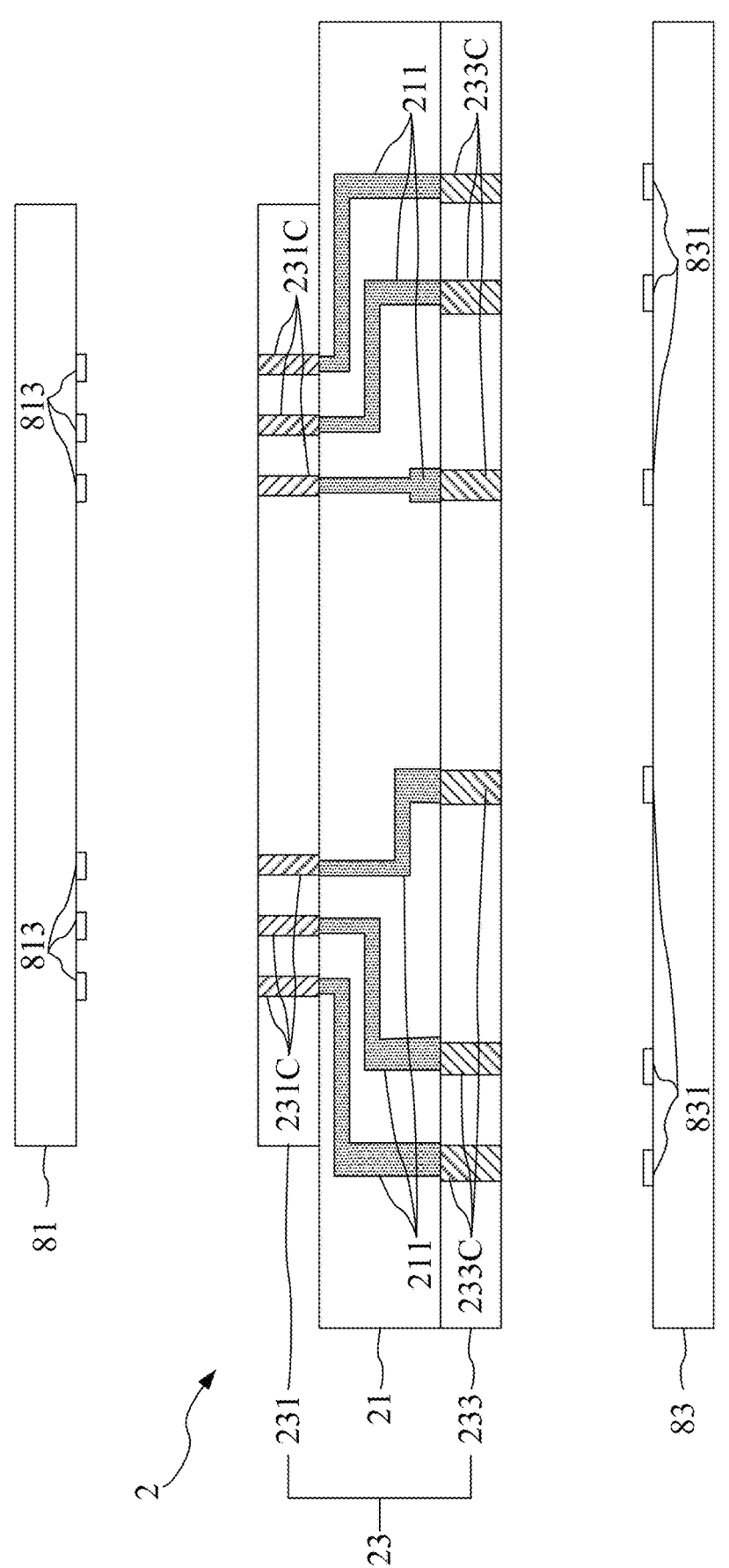
FIG. 2B is a schematic diagram of an elastic interposer according to some embodiments of the present disclosure.

Refer to FIG. 2A and FIG. 2B. FIG. 2A shows a schematic diagram of an elastic interposer 2 according to some embodiments of the present disclosure. FIG. 2B shows another schematic diagram of the elastic interposer 2 according to some embodiments of the present disclosure. More specifically, the elastic interposer 2 includes a flexible substrate 21 and a conductive device 23. The flexible substrate 21 includes a plurality of circuits 211, and has a first surface 21S1 and a second surface 21S2. For example, the flexible substrate 21 can be a flexible circuit board, and the plurality of circuits 211 can be conductive traces in the flexible circuit board.

In some embodiments, the conductive device 23 includes a first flexible conductive element 231 and a second flexible conductive element 233. The first flexible conductive element 231 has a third surface 231S1 and a fourth surface 231S2, and the second flexible conductive element 233 has a fifth surface 233S1 and a sixth surface 233S2. The first flexible conductive element 231 includes a first flexible body 2311 and a plurality of first elastic conductive portions 231C. The first flexible conductive element 231 is disposed on the first surface 21S1 of the flexible substrate 21, and the fourth surface 231S2 of the first flexible conductive element 231 faces the first surface 21S1 of the flexible substrate 21 and is bonded to the flexible substrate 21. The second flexible conductive element 233 includes a second flexible body 2311 and a plurality of second elastic conductive portions 233C. The second flexible conductive element 233 is disposed on the second surface 21S2 of the flexible substrate 21, and the fifth surface 233S1 of the second flexible conductive element 233 faces the second surface 21S2 of the flexible substrate 21 and is bonded to the flexible substrate 21. In some embodiments, the first elastic conductive portions 231C can be flexible, and the second elastic conductive portions 233C can also be flexible.

In some embodiments, the plurality of first elastic conductive portions 231C of the first flexible conductive element 231 are disposed in the first flexible body 2311, and each has a first terminal 231C1 and a second terminal 231C2. The first terminals 231C1 and the second terminals 231C2 of the plurality of first elastic conductive portions 231C are respectively exposed on the third surface 231S1 and the fourth surface 231S2 of the first flexible body 2311. The plurality of the second elastic conductive portions 233C of the second flexible conductive element 233 are disposed in the second flexible body 2331, and each has a first terminal 233C1 and a second terminal 233C2. The first terminals 233C1 and the second terminals 233C2 of the plurality of second elastic conductive portions 233C are respectively exposed on the fifth surface 233S1 and the sixth surface 233S2 of the second flexible body 2331.

In some embodiments, each of the circuits 211 of the flexible substrate 21 has a first terminal 211A and a second terminal 211B. The first terminals 211A of the circuits 211 are exposed on the first surface 21S1 of the flexible substrate 21, and are electrically connected to the second terminals 231C2 of the first elastic conductive portions 231C of the first flexible conductive element 231. The second terminals 211B of the circuits 211 are exposed on the second surface 21S2 of the flexible substrate 21, and are electrically connected to the first terminals 233C1 of the second elastic conductive portions 233C of the second flexible conductive element 233.

In some embodiments, the first terminals 231C1 of the first elastic conductive portions 231C of the first flexible conductive element 231 are further configured to come into electrical contact with a plurality of contacts 813 of an object

81 under test, and the second terminals 233C2 of the second elastic conductive portions 233C of the second flexible conductive element 233 are further configured to come into electrical contact with a plurality of contacts 831 of a hard substrate 83. As such, an electrical path produced by the circuits 211, the first elastic conductive portions 231C and the second elastic conductive portions 233C of the elastic interposer 2 can be used to transmit test signals (for example, high-frequency test signals) between the object 81 under test and the hard substrate 83.

In some embodiments, when the object 81 under test comes into contact with the first terminals 231C1 of the first elastic conductive portions 231C, the flexible substrate 21, the first flexible conductive element 231 and the second flexible conductive element 233 are simultaneously deformed based on a force of contact with the object 81 under test. In other words, the elastic interposer 2 of the present disclosure is able to buffer by flexible elements a force applied when the object 81 under test comes into contact and to maintain good electrical contact. On the other hand, when the hard substrate 83 comes into contact with the second terminals 233C2 of the second elastic conductive portions 233C, the flexible substrate 21, the first flexible conductive element 231 and the second flexible conductive element 233 are simultaneously deformed based on a force of contact with the hard substrate 83. In other words, the elastic interposer 2 of the present disclosure is able to buffer by flexible elements a force applied when the hard substrate 83 comes into contact and to maintain good electrical contact.

In some embodiments, since dimensions of the object 81 under test (for example, dimensions of a tested surface of the object under test) are different from (for example, less than) dimensions of the hard substrate 83 (for example, dimensions of a tested surface of a printed circuit board), dimensions of the first flexible conductive element 231 (for example, dimensions of an area in contact with the object under test) corresponding to the object 81 under test are different from (for example, less than) dimensions of the second flexible conductive element 233 (for example, dimensions of an area in contact with the hard substrate) corresponding to the hard substrate 83.

Further, an average gap of the plurality of contacts 813 of the object 81 under test is less than an average gap of the plurality of contacts 831 of the hard substrate 83. In other words, a unit area density of the plurality of contacts 813 of the object 81 under test is greater than a unit area density of the plurality of contacts 831 of the hard substrate 83. Thus, the circuits 211 of the flexible substrate 21 are needed to correspond the plurality of contacts 831 of the hard substrate 83 having a greater average gap or a smaller unit area density to the plurality of contacts 813 of the object 81 under test having a smaller average gap or a greater unit area density, and to generate an electrical connection by the corresponding first flexible conductive element 231 (between the flexible substrate 21 and the object 81 under test) and the second flexible conductive element 233 (between flexible substrate 21 and the hard substrate 83).

In some embodiments, since the object 81 under test needs to undergo testing in a test socket (not shown), the dimensions of the first flexible conductive element 231 (for example, dimensions of an area in contact with the object under test) corresponding to the object 81 under test need to be less than dimensions of the object 81 under test which the test socket can receive. On the basis of the structural conditions above, in some embodiments, an area by which the first flexible conductive element 231 is in contact with the first surface 21S1 of the flexible substrate 21 is less than an area by which the second flexible conductive element 233 is in contact with the second surface 21S2 of the flexible substrate 21.

In some embodiments, since an area of one single contact 813 of the object 81 under test is less than an area of one single contact 831 of the hard substrate 83, configuration details are as follows: (1) the first terminals 231C1 (corresponding to the contacts 813) and the second terminals 231C2 of the first elastic conductive portions 231C can have the same area; (2) the first terminals 233C1 and the second terminals 233C2 (corresponding to the contacts 831) of the second elastic conductive portions 233C can have the same area; and (3) in each of the circuits 211, an area of the first terminal 211A (corresponding to the second terminal 231C2 of the first flexible conductive element 231) can be less than an area of the corresponding second terminal 211B (corresponding to the first terminal 233C1 of the second flexible conductive element 233).

On the basis of the configuration details above, now that (1) a contact area between first terminal 211A of each of the circuits 211 and the corresponding second terminal 231C2 of the first flexible conductive element 231 is less than a contact area between the second terminal 211B of each of the circuits 211 and the corresponding first terminal 233C1 of the second flexible conductive element 233, and (2) the number by which the first terminals 211A of the circuits 211 come into contact with the corresponding second terminals 231C2 of the first flexible conductive element 231 is equal to the number by which the second terminals 211B of the circuits 211 come into contact with the corresponding first terminals 233C1 of the second flexible conductive element 233. Thus, a total contact area between the first terminals 211A of the circuits 211 and the corresponding second terminals 231C2 of the first flexible conductive element 231 is less than a total contact area between the second terminals 211B of the circuits 211 and the corresponding first terminals 233C1 of the second flexible conductive element 233. In other words, an area of electrical contact between the first flexible conductive element 231 and the first surface 21S1 of the flexible substrate 21 is less than an area of electrical contact between the second flexible conductive element 233 and the second surface 21S2 of the flexible substrate 21.

Figure 2C:
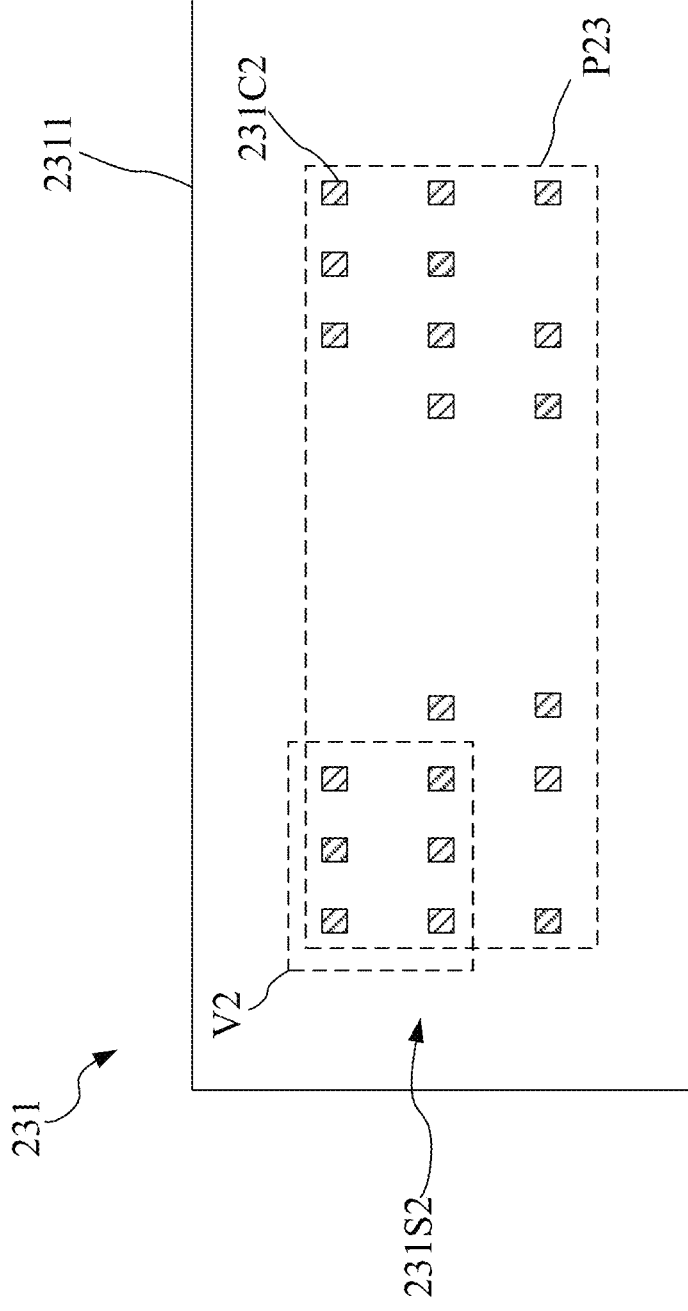
FIG. 2C is a bottom view of a first flexible conductive element according to some embodiments of the present disclosure.
Figure 2D:
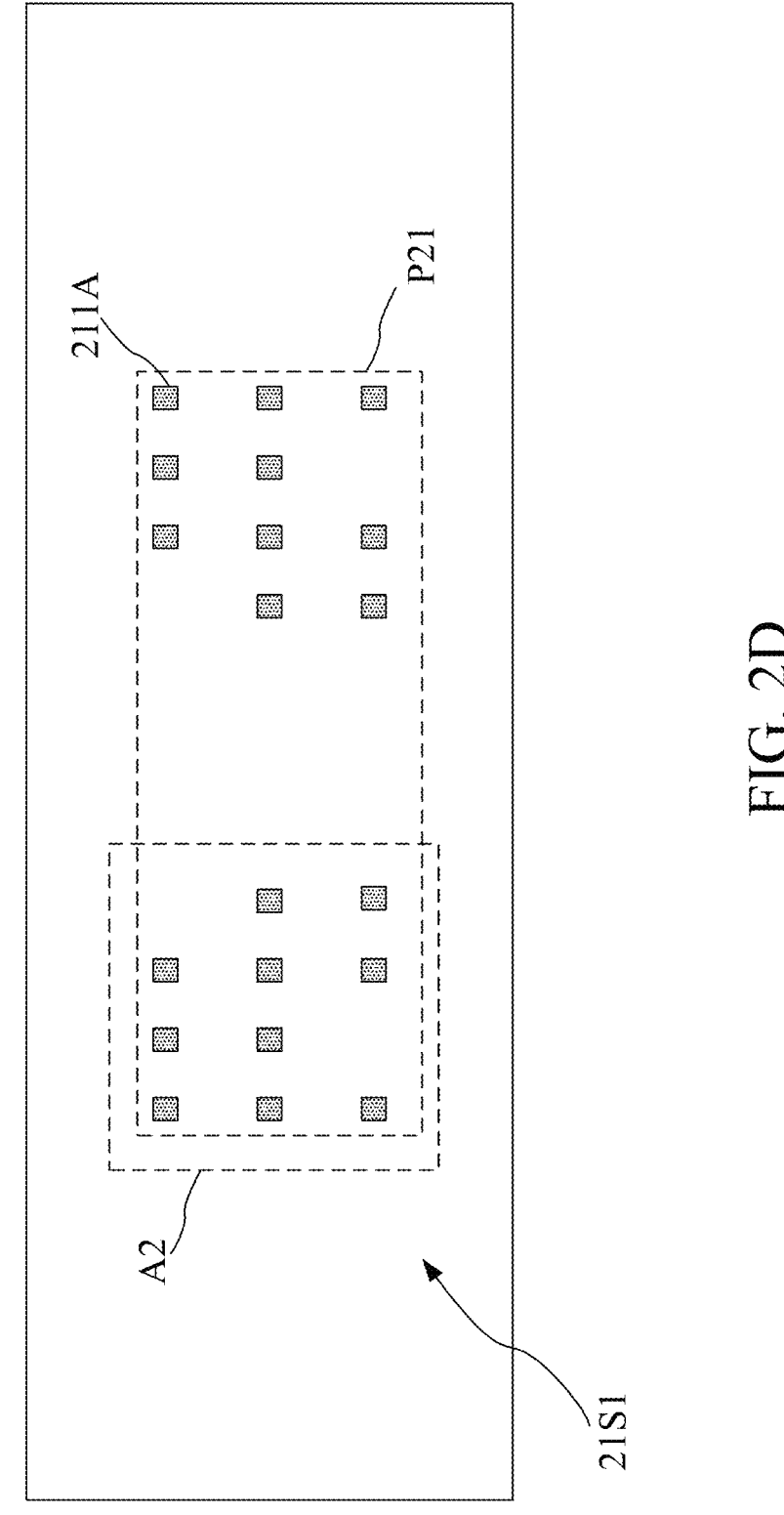
FIG. 2D is a top view of a flexible substrate according to some embodiments of the present disclosure.
Figure 2E:
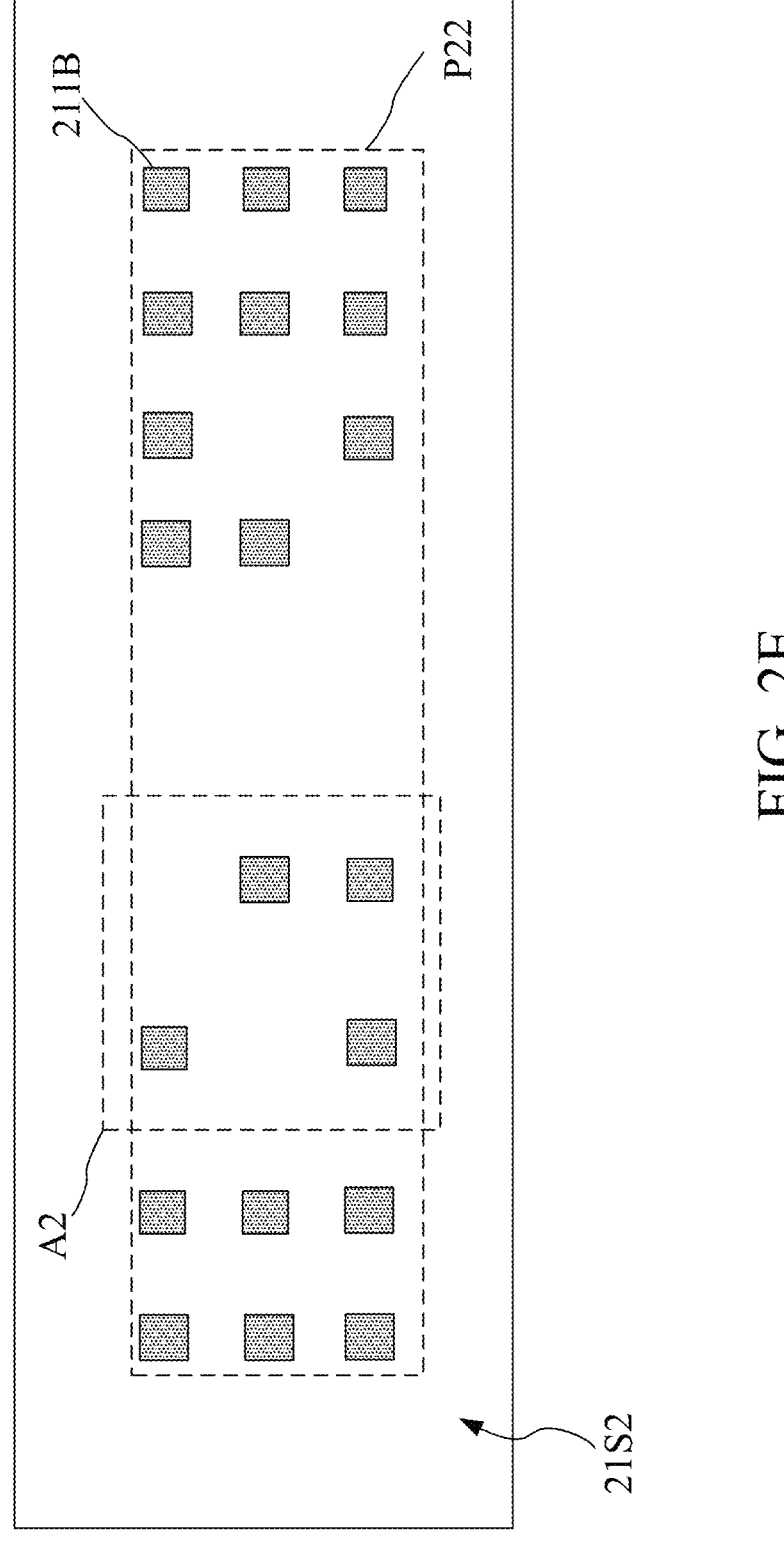
FIG. 2E is a bottom view of a flexible substrate according to some embodiments of the present disclosure.
Figure 2F:
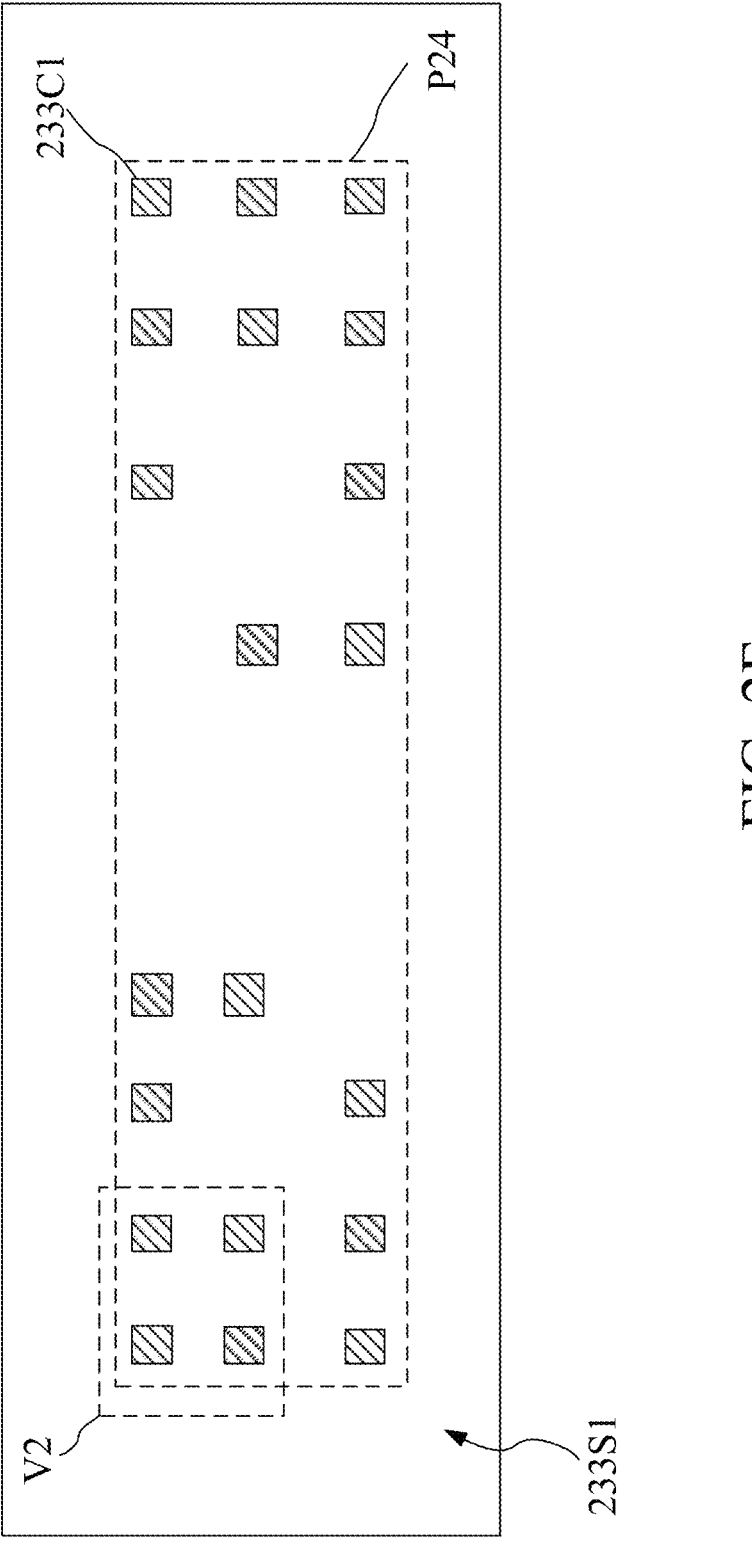
FIG. 2F is a top view of a second flexible conductive element according to some embodiments of the present disclosure.

Refer to FIG. 2C to FIG. 2F. FIG. 2C shows a bottom view of the first flexible conductive element 231 according to some embodiments of the present disclosure. FIG. 2D shows a top view of the flexible substrate 21 according to some embodiments of the present disclosure. FIG. 2E shows a bottom view of the flexible substrate 21 according to some embodiments of the present disclosure. FIG. 2F shows a top view of the second flexible conductive element 233 according to some embodiments of the present disclosure.

In some embodiments, the first terminals 211A of the circuits 211 show a first pattern P21 on the first surface 21S1 of the flexible substrate 21, and the second terminals 211B of the circuits 211 show a second pattern P22 on the second surface 21S2 of the flexible substrate 21, wherein the first pattern P21 is different from the second pattern P22. In other words, there is a change in a layout and traces of the circuits 211 from the first terminals 211A through the flexible substrate 21 to the second terminals 211B, and so the first pattern P21 shown by the first terminals 211A on the first surface 21S1 is different from the second pattern P22 shown by the second terminals 211B on the second surface 21S2.

In some embodiments, the second terminals 231C2 of the plurality of first elastic conductive portions 231C of the first flexible conductive element 231 are exposed on the fourth surface 231S2 of the first flexible body 2311 and show a third pattern P23, and the first terminals 233C1 of the plurality of second elastic conductive portions 233C of the second flexible conductive element 233 are exposed on the fifth surface 233S1 of the second flexible body 2331 and show a fourth pattern P24.

In some embodiments, the first pattern P21 and the third pattern P23 are mirror images, and the first terminals 211A of the plurality of circuits 211 and the second terminals 231C2 of the plurality of first elastic conductive portions 231C are in one-to-one correspondence. The second pattern P22 and the fourth pattern P24 are mirror images, and the second terminals 211B of the plurality of circuits 211 and the first terminals 233C1 of the plurality of second elastic conductive portions 233C are in one-to-one correspondence.

In some embodiments, by using regions with a same area as a comparison reference, a dot density of the first pattern P21 is greater than a dot density of the second pattern P22. As a matter of course, the third pattern P23 is different from the fourth pattern P24, and a dot density of the third pattern P23 is greater than a dot density of the fourth pattern P24.

Referring to FIGS. 2D and 2E, in some embodiments, a density of the first terminals 211A of the circuits 211 within a unit area A2 is greater than a density of the second terminals 211B of the circuits 211 within a same unit area A2. In other words, within a range of the same area A2, the density of the first terminals 211A of the circuits 211 is denser, and the density of the second terminals 211B of the circuits 211 is sparser.

In some embodiments, a minimum gap between any two of the first terminals 211A in the first pattern P21 is less than a minimum gap between any two of the second terminals 211B in the second pattern P22. In some embodiments, by ruling out the first terminal 211A at an extremum (farther away from a center or closer to an edge) in the first pattern P21 and ruling out the second terminal 211B at an extremum (farther away from a center or closer to an edge) in the second pattern P22, the minimum gap between any two of the first terminals 211A in the first pattern P21 is less than the minimum gap between any two of the second terminals 211B in the second pattern P22. In some embodiments, by ruling out a dummy contact in the first pattern P21 and a dummy contact in the second pattern P22, the minimum gap between any two of the first terminals 211A in the first pattern P21 is less than the minimum gap between any two of the second terminals 211B in the second pattern P22.

Referring to FIGS. 2A, 2C and 2F, in some embodiments, a density of the first elastic conductive portions 231C within a unit volume V2 is greater than a density of the second elastic conductive portions 233C within the same unit volume V2. In other words, within a range of the same volume V2, an arrangement density of the first elastic conductive portions 231C is denser, and an arrangement density of the second elastic conductive portions 233C is sparser.

Accordingly, with the structural configuration details above, the elastic interposer 2 of the present disclosure is able to electrically connect contacts having a higher density on an object under test (for example, an integrated circuit) to contacts having a lower density on a hard substrate (for example, a printed circuit board). Thus, the elastic interposer 2 of the present disclosure achieves the function of space transformation and produces an effective electrical path between the contacts of the object under test and the contacts of the hard substrate.

Figure 2G:
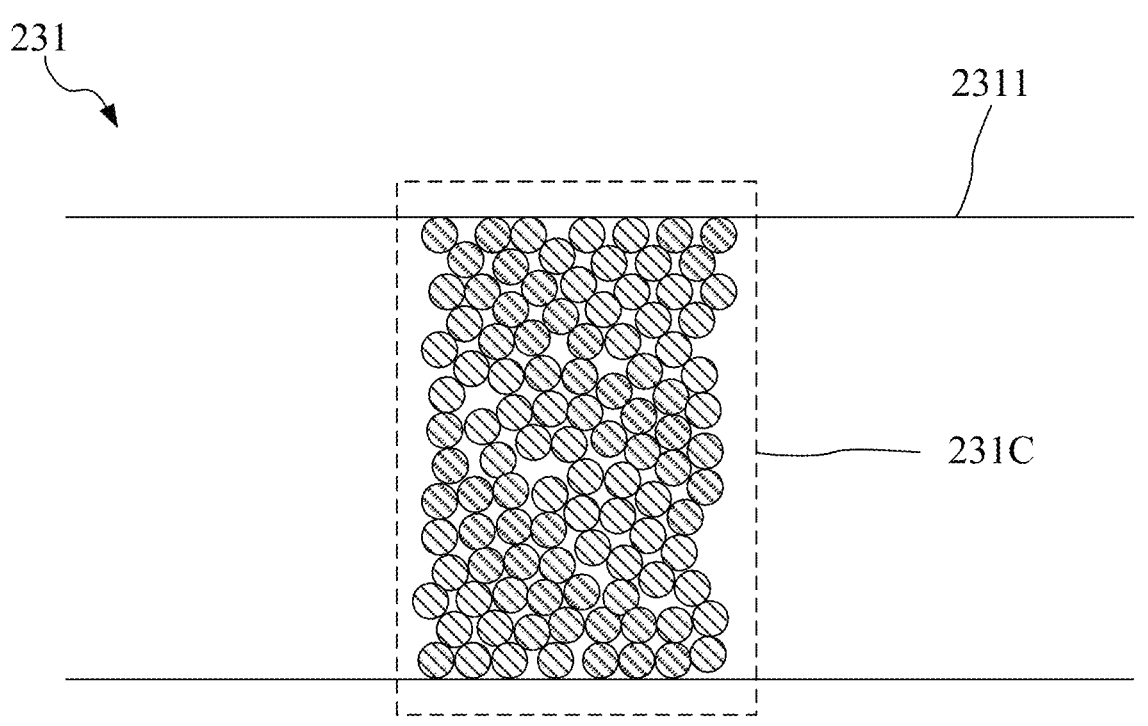
FIG. 2G is an enlarged schematic diagram of a first flexible conductive element of a conductive device according to some embodiments of the present disclosure.
Figure 2H:
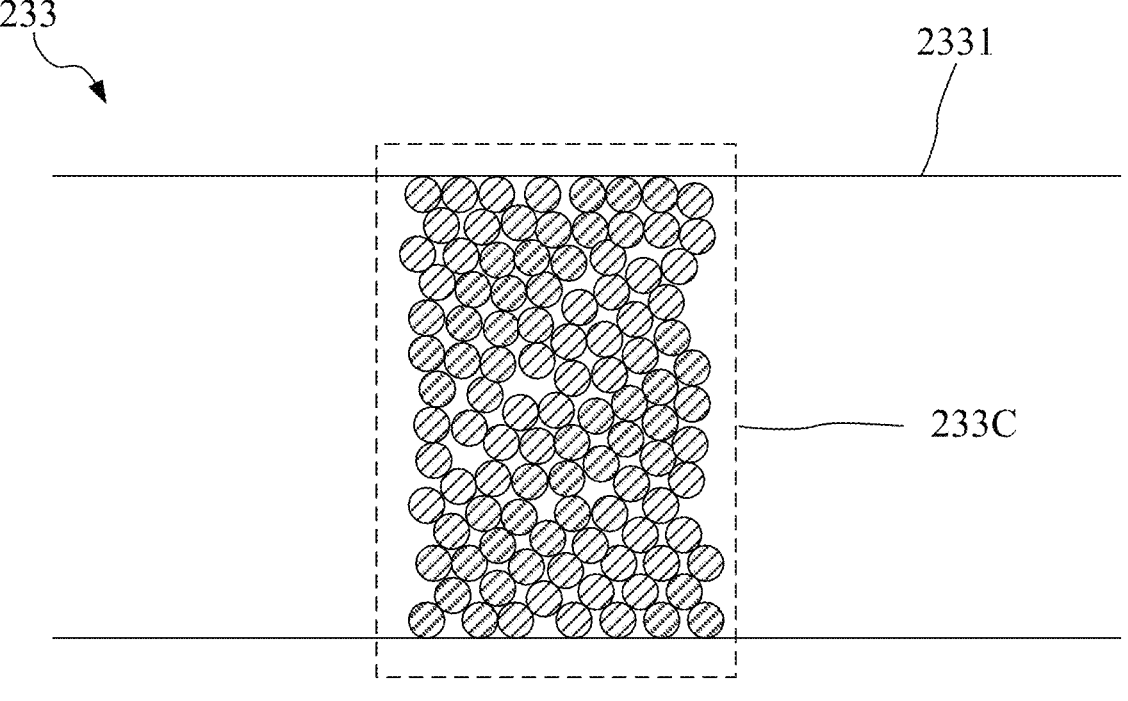
FIG. 2H is an enlarged schematic diagram of a second flexible conductive element of a conductive device according to some embodiments of the present disclosure.

Refer to FIG. 2G to FIG. 2H. FIG. 2G shows an enlarged schematic diagram of the first flexible conductive element 231 of the conductive device 23 of the present disclosure.

FIG. 2H shows an enlarged schematic diagram of the second flexible conductive element 233 of the conductive device 23 of the present disclosure. In some embodiments, the first flexible conductive element 231 is a conductive paste, and the first flexible body 2311 is formed of a sticky material. In some embodiments, the fourth surface 231S2 of the first flexible conductive element 231 is made of a sticky material. In some embodiments, the fourth surface 231S2 of the first flexible conductive element 231 is attached with a first adhesive layer (not shown). In the embodiments above, the objective thereof is to detachably (or referred to as removably) fix the first flexible conductive element 231 on the first surface 21S1 of the flexible substrate 21. In some embodiments, when the first flexible conductive element 231 is detached from the flexible substrate 21, the first flexible conductive element 231 and the first adhesive layer are integrally detached from the flexible substrate 21. In other words, the first flexible conductive element 231 and the first adhesive layer are regarded as a whole and are simultaneously detached from the flexible substrate 21.

In some embodiments, when the fourth surface 231S2 of the first flexible conductive element 231 is attached with an adhesive layer, the first elastic conductive portions 231C pass through the adhesive layer and are electrically connected to the first terminals 211A of the circuits 211. For example, when the adhesive layer is attached on the fourth surface 231S2 of the first flexible conductive element 231, the adhesive layer can be configured to avoid the second terminals 231C2 of the first elastic conductive portions 231C, such that when the first flexible conductive element 231 is fixed to the flexible substrate 21, the electrical connection between the first elastic conductive portions 231C and the circuits 211 is not hindered. For example, the first elastic conductive portions 231C can slightly protrude from the fourth surface 231S2, such that when the first flexible conductive element 231 is fixed to the flexible substrate 21, the electrical connection between the first elastic conductive portions 231C and the circuits 211 is not hindered.

In some embodiments, each of the first elastic conductive portions 231C includes a plurality of metal particles (for example, gold-plated copper particles or gold-plated nickel particles), and is arranged as a column (for example, a circular column or a square column) in the first flexible body 2311. When the first flexible conductive element 231 is attached on the first surface 21S1 of the flexible substrate 21 through the first flexible body 2311, the second terminals 231C2 of the first elastic conductive portions 231C are aligned and are electrically connected to the first terminals 211A of the circuits 211 of the flexible substrate 21.

Similarly, in some embodiments, the second flexible conductive element 233 is a conductive paste, and the second flexible body 2331 is formed of a sticky material. In some embodiments, the fifth surface 233S1 of the second flexible conductive element 233 is made of a sticky material. In some embodiments, the fifth surface 233S1 of the second flexible conductive element 233 is attached with a second adhesive layer (not shown). In the embodiments above, the objective thereof is to detachably (or referred to as removably) fix the second flexible conductive element 233 on the second surface 21S2 of the flexible substrate 21. In some embodiments, when the second flexible conductive element 233 is detached from the flexible substrate 21, the second flexible conductive element 233 and the second adhesive layer are integrally detached from the flexible substrate 21. In other words, the second flexible conductive element 233 and the second adhesive layer are regarded as a whole and are simultaneously detached from the flexible substrate 21.

In some embodiments, each of the second elastic conductive portions 233C includes a plurality of metal particles (for example, gold-plated copper particles or gold-plated nickel particles), and is arranged as a column (for example, a circular column or a square column) in the second flexible body 2331. When the second flexible conductive element 233 is attached on the second surface 21S2 of the flexible substrate 21 through the second flexible body 2331, the first terminals 233C1 of the second elastic conductive portions 233C are aligned and are electrically connected to the second terminals 211B of the circuits 211 of the flexible substrate 21.

In one embodiment, when the fifth surface 233S1 of the second flexible conductive element 233 is attached with an adhesive layer, the second elastic conductive portions 233C pass through the adhesive layer and are electrically connected to the first terminals 211A of the circuits 211. For example, when the adhesive layer is attached on the fourth surface 231S2 of the first flexible conductive element 231, the adhesive layer can be configured to avoid the second terminals 231C2 of the first elastic conductive portions 231C, such that when the first flexible conductive element 231 is fixed to the flexible substrate 21, the electrical connection between the first elastic conductive portions 231C and the circuits 211 is not hindered. For example, the first elastic conductive portions 231C can slightly protrude from the fourth surface 231S2, such that when the first flexible conductive element 231 is fixed to the flexible substrate 21, the electrical connection between the first elastic conductive portions 231C and the circuits 211 is not hindered.

In some embodiments, an average size of the first metal particles of the first elastic conductive portions 231C is different from an average size of the second metal particles of the second elastic conductive portions 233C. For example, the first metal particles of the first elastic conductive portions 231C are substantially round in shape, and each of the first metal particles has a first particle size. The size of each of the first metal particles is fundamentally the same as that of another, and the average size of the first metal particles is approximately the first particle size of the first metal particles. For example, the second metal particles of the second elastic conductive portions 233C are substantially round in shape, and each of the second metal particles has a second particle size. The size of each of the second metal particles is fundamentally the same as that of another, and the average size of the second metal particles is approximately the second particle size of the second metal particles. In the examples above, the average size (that is, the first particle size) of the first metal particles is different from the average size (that is, the second particle size) of the second metal particles.

When the configuration of the conductive device 23 above, when the first flexible conductive element 231 and the second flexible conductive element 233 respectively come into contact with the object 81 under test and the hard substrate 83, the first flexible body 2311 of the first flexible conductive element 231 and the second flexible body 2331 of the second flexible conductive element 233 are able to buffer and absorb a force of contact generated therefrom, so as to effectively prevent damage. Meanwhile, the three including the first elastic conductive portions 231C of the first flexible conductive element 231, the second flexible conductive portions 233C of the second flexible conductive element 233 and the circuits 211 of the flexible substrate 21 in contact are connected and form a shorter electrical path, which is capable of efficiently and correctly transmit high-frequency test signals transmitted between the object 81 under test and the hard substrate 83. In some embodiments, since the first flexible conductive element 231 and the second flexible conductive element 233 can be removed from the flexible substrate 21 and be replaced, application flexibility of the elastic interposer 2 can be significantly enhanced.

In some embodiments, the first flexible conductive element 231, the second flexible conductive element 233 and the flexible substrate 21 respectively have a first thickness, a second thickness and a third thickness. To satisfy different application scenarios or requirements, the first thickness, the second thickness and the third thickness can be adjusted to be the same, different or partially the same.

It should be noted that, in the embodiments above and the associated drawings, the configuration details of the circuits (for example, the circuits 111 and 211) in the flexible substrate (for example, the flexible substrates 11 and 21), the numbers of the conductive portions (for example, the first elastic conductive portions 131C and 231C, and the second elastic conductive portions 231C and 233C), and the first pattern, the second pattern, the third pattern and the fourth pattern shown by the conductive portions or the circuits on the individual surfaces are merely examples, and are not to be construed as limitations to the implementation forms of the present disclosure.

In conclusion, the elastic interposer and the conductive device of the embodiments of the present disclosure are, by means of absorbing and buffering by the flexible conductive elements the impact brought by various types of physical contacts, capable of reducing damage of an object under test and a hard substrate. Moreover, the elastic interposer and the conductive device of the embodiments of the present disclosure, by means of a shorter electrical path produced by circuits of flexible substrates and conductive portions of flexible conductive elements, efficiently and correctly transmit high-frequency test signals between an object under test and a hard substrate, and can avoid the use of conventional structure of joining the space transformation substrates and hard substrates through soldering, thereby effectively reducing impedance resulted from an electrical path.

Although the disclosure and advantages thereof are described above, persons skilled in the art understand that various changes, replacements and substitutions may be made to the disclosure without departing from the spirit and scope defined in the appended claims of the disclosure. For instance, the aforesaid processes may be implemented with different methods and replaced with any other processes or a combination thereof.

The scope of the disclosure is not restricted to specific embodiments of any processes, machines, manufacturing, matter compositions, means, methods and steps described herein. The disclosure described herein enables persons skilled in the art to implement the disclosure with any existing or potential processes, machines, manufacturing, matter compositions, means, methods or steps having the same function or capable of achieving substantially the same result as disclosed in the aforesaid embodiments. Therefore, these processes, machines, manufacturing, matter compositions, means, methods and steps fall within the scope of the appended claims of the disclosure.

What is claimed is:

1. An elastic interposer, comprising:
   a flexible substrate, comprising a plurality of circuits, wherein first terminals of the circuits are exposed on a first surface of the flexible substrate, second terminals of the circuits are exposed on a second surface of the flexible substrate, the first terminals of the circuits show a first pattern on the first surface, the second terminals of the circuits show a second pattern on the second surface, and the first pattern is different from the second pattern; and a conductive device, comprising:

a first flexible conductive element, disposed on the first surface of the flexible substrate, comprising a plurality of first elastic conductive portions, wherein first terminals of the first elastic conductive portions are exposed on a third surface of the first flexible conductive element, and second terminals of the first elastic conductive portions are exposed on a fourth surface of the first flexible conductive element and are electrically connected to the first terminals of the circuits; and a second flexible conductive element, disposed on the second surface of the flexible substrate, comprising a plurality of second elastic conductive portions, wherein first terminals of the second elastic conductive portions are exposed on a fifth surface of the second flexible conductive element and are electrically connected to the second terminals of the circuits, and second terminals of the second elastic conductive portions are exposed on a sixth surface of the second flexible conductive element;

wherein each of the first elastic conductive portions comprises a plurality of first metal particles, and each of the second elastic conductive portions comprises a plurality of second metal particles, wherein an average size of the first metal particles is different from an average size of the second metal particles.

2. The elastic interposer of claim 1, wherein a total contact area of electrical contacts between the first flexible conductive element and the first surface of the flexible substrate is less than a total contact area of electrical contacts between the second flexible conductive element and the second surface of the flexible substrate.

3. The elastic interposer of claim 1, wherein the second terminals of the first elastic conductive portions are configured to come into electrical contact with a plurality of contacts of an object under test, and the second terminals of the second elastic conductive portions are configured to come into electrical contact with a plurality of contacts of a hard substrate.

4. The elastic interposer of claim 3, wherein when the object under test comes into contact with the first terminals of the first elastic conductive portions, the flexible substrate, the first flexible conductive element and the second flexible conductive element are simultaneously deformed based on a force of contact with the object under test.

5. The elastic interposer of claim 1, wherein the first flexible conductive element is detachably fixed on the first surface of the flexible substrate, and the second flexible conductive element is detachably fixed on the second surface of the flexible substrate.

6. The elastic interposer of claim 5, further comprising a first adhesive layer and a second adhesive layer, wherein the first adhesive layer is disposed between the first flexible conductive element and the flexible substrate, and the second adhesive layer is disposed between the second flexible conductive element and the flexible substrate.

7. The elastic interposer of claim 6, wherein the first adhesive layer and the first flexible conductive element are integrally detached from the flexible substrate, and the second adhesive layer and the second flexible conductive element are integrally detached from the flexible substrate.

8. The elastic interposer of claim 6, wherein the first elastic conductive portions pass through the first adhesive layer so as to be electrically connected to the first terminals of the circuits, and the second elastic conductive portions pass through the second adhesive layer so as to be electrically connected to the second terminals of the circuits.

9. The elastic interposer of claim 1, wherein dimensions of the first flexible conductive element are different from dimensions of the second flexible conductive element.

10. A conductive device of an elastic interposer, the conductive device comprising:

a first flexible conductive element, disposed on a first surface of a flexible substrate, comprising:

a first flexible body; and a plurality of first elastic conductive portions, disposed in the first flexible body, and configured to be electrically connected to first terminals of a plurality of circuits of the flexible substrate; and a second flexible conductive element, disposed on a second surface of the flexible substrate, comprising:

a second flexible body;

a plurality of second elastic conductive portions, disposed in the second flexible body, and configured to be electrically connected to second terminals of the circuits of the flexible substrate;

wherein, the first terminals of the circuits are exposed on the first surface and show a first pattern, the second terminals of the circuits are exposed on the second surface and show a second pattern, and the first pattern is different from the second pattern;

wherein each of the first elastic conductive portions comprises a plurality of first metal particles, and each of the second elastic conductive portions comprises a plurality of second metal particles, wherein an average size of the first metal particles is different from an average size of the second metal particles.

11. The conductive device of claim 10, wherein the first elastic conductive portions are disposed in the first flexible body, first terminals of the first elastic conductive portions are exposed on a third surface of the first flexible body, and second terminals of the first elastic conductive portions are exposed on a fourth surface of the first flexible body.

12. The conductive device of claim 11, wherein the second elastic conductive portions are disposed in the second flexible body, first terminals of the second elastic conductive portions are exposed on a fifth surface of the second flexible body, and second terminals of the second elastic conductive portions are exposed on a sixth surface of the second flexible body.

13. The conductive device of claim 12, wherein the second terminals of the first elastic conductive portions are configured to be electrically connected to the first terminals of the circuits of the flexible substrate, and the first terminals of the second elastic conductive portions are configured to be electrically connect to the second terminals of the circuits of the flexible substrate.

14. The conductive device of claim 13, wherein the second terminals of the first flexible conductive portions exposed on the fourth surface of the first flexible body show a third pattern on the fourth surface of the first flexible body, the first terminals of the second flexible conductive portions exposed on the fifth surface of the second flexible body show a fourth pattern on the fifth surface of the second flexible body, and the third pattern is different from the fourth pattern.

15. The conductive device of claim 10, wherein each of the first elastic conductive portions is shaped as a column in the first flexible body, and each of the second elastic conductive portions is shaped as a column in the second flexible body.

16. The conductive device of claim 10, wherein the first flexible conductive element and the second flexible conductive element are a conductive paste.

\* \* \* \* \*